US011264810B2

(12) United States Patent
Edelshtein et al.

(10) Patent No.: US 11,264,810 B2

(45) Date of Patent: Mar. 1, 2022

(54) BALANCING CHARGING OF LITHIUM ION BATTERIES BY A SWITCHING CIRCUITRY

(71) Applicant: StoreDot Ltd., Herzeliya (IL)

(72) Inventors: Avraham Edelshtein, Herzelia (IL); Daniel Aronov, Netanya (IL)

(73) Assignee: STOREDOT LTD., Herzeliya (IL)

( * ) Notice: Subject to any disclaimer, the term of this patent is extended or adjusted under 35 U.S.C. 154(b) by 186 days.

(21) Appl. No.: 16/360,272

(22) Filed: Mar. 21, 2019

(65) Prior Publication Data

US 2020/0303930 A1 Sep. 24, 2020

(51) Int. Cl.

*H02J 7/00* (2006.01)
*H01M 10/42* (2006.01)
*G01R 31/382* (2019.01)

(52) U.S. Cl.

CPC .......... *H02J 7/0019* (2013.01); *G01R 31/382* (2019.01); *H01M 10/425* (2013.01); *H01M 2010/4271* (2013.01)

(58) Field of Classification Search

CPC .... H02J 7/0019; H02J 7/00712; H02J 7/0049; H01M 10/425; H01M 2010/4271; H01M 10/441; G01R 31/382; Y02E 60/10

See application file for complete search history.

(56) References Cited

U.S. PATENT DOCUMENTS 5,744,936 A * 4/1998 Kawakami ........ H01M 10/4207 320/120

9,373,970 B2 * 6/2016 Feuerstack ............. B60L 58/21

9,472,804 B2 10/2016 Burshtain et al.

9,614,382 B2 * 4/2017 Peterswerth .......... H02J 7/0026

10,096,859 B2 10/2018 Burshtain et al.

10,110,036 B2 10/2018 Aronov 10,199,677 B2 2/2019 Drach et al.

10,297,855 B2 * 5/2019 Qiao ..................... H02J 7/0024

2013/0300370 A1 * 11/2013 Hotta ................. H01M 10/482 320/117

2014/0039735 A1 * 2/2014 Major .................... H02J 7/007 701/22

(Continued)

FOREIGN PATENT DOCUMENTS

WO WO 2018/109774 A1 6/2018

OTHER PUBLICATIONS

U.S. Appl. No. 16/243,190, filed Jan. 9, 2019, Kuks et al.

*Primary Examiner* — Nha T Nguyen

(74) *Attorney, Agent, or Firm* — Reches Patents

(57) ABSTRACT

Systems and methods are provided for balancing battery modules following fast charging, particularly with respect to fast charging lithium ion batteries with metalloid-based anodes. Charge balancing among multiple battery modules connected in series may be carried out by short-circuiting fully charged modules while adjusting the voltage and/or current level supplied by a charger, to fully charge remaining modules. A balancing module comprising a controller and switching circuitry may be configured to implement the charge balancing in association with the charger and its battery management system, and monitoring the battery modules. Advantageously, disclosed switching balancing is more efficient than prior art passive balancing and simpler in implementation than prior art active balancing.

18 Claims, 3 Drawing Sheets

100

90A 90 110
Charger
Controller
115
120 120A
80 87 85
120B

(56) References Cited

U.S. PATENT DOCUMENTS

2014/0354232 A1* 12/2014 Carcouet ................. B60L 53/11 320/118
2015/0028817 A1* 1/2015 Brockerhoff ............ B60L 58/19 320/137
2016/0118819 A1* 4/2016 Chatroux .............. B60L 3/0046 320/112
2017/0093183 A1* 3/2017 Shen ..................... H02J 7/0019
2017/0294687 A1 10/2017 Burshtain et al.
2017/0353040 A1* 12/2017 Pickett .................. H02J 7/0021
2017/0373512 A1* 12/2017 Wang ...................... B60L 50/64
2018/0050602 A1 2/2018 Aronov
2018/0205238 A1* 7/2018 Uno ...................... H02M 7/483
2018/0212236 A1 7/2018 Jacob et al.
2018/0219391 A1* 8/2018 Ishikawa ................. B60L 58/19
2019/0113580 A1* 4/2019 Tenmyo ............... G01R 31/392
2019/0115768 A1* 4/2019 Taylor, Jr. ........ G01R 19/16542
2020/0028375 A1* 1/2020 Ono ...................... H02J 7/0013
2020/0099110 A1* 3/2020 Lin ....................... H02J 7/0019
2020/0287394 A1* 9/2020 Angelis ................. H02J 7/0019

* cited by examiner

BALANCING CHARGING OF LITHIUM ION BATTERIES BY A SWITCHING CIRCUITRY

BACKGROUND OF THE INVENTION

1. Technical Field

The present invention relates to the field of energy storage devices, and more particularly, to charge balancing in fast-charging lithium ion batteries.

2. Discussion of Related Art

Lithium ion batteries are used for a growing range of applications, as their safety and performance are improved. Lithium ion batteries typically include a large number of cells which undergo simultaneous charging and discharging cycles, but differ in their performance and degradation rates.

SUMMARY OF THE INVENTION

The following is a simplified summary providing an initial understanding of the invention. The summary does not necessarily identify key elements nor limit the scope of the invention, but merely serves as an introduction to the following description.

One aspect of the present invention provides a method of charge balancing among a plurality of battery modules connected in series, each module comprising at least one cell, the method comprising short-circuiting fully charged modules while adjusting a voltage and/or current level supplied by a charger, to fully charge remaining modules.

One aspect of the present invention provides a balancing module comprising a controller and a switching circuitry, the balancing module operating with a charger and a battery comprising a plurality of battery modules, wherein the controller is configured to short-circuit, via the switching circuitry, fully charged modules, and adjust a voltage and/or current level supplied by the charger, to fully charge remaining modules.

One aspect of the present invention provides a system comprising: a charger, a battery comprising a plurality of battery modules, and a balancing module comprising a controller and a switching circuitry, the balancing module operating with the charger and the battery to short-circuit, via the switching circuitry, fully charged modules, and adjust a voltage and/or current level supplied by the charger, to fully charge remaining modules, wherein the balancing module is implemented within at least one of the charger and the battery.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings.

DETAILED DESCRIPTION OF THE INVENTION

Figure 1:
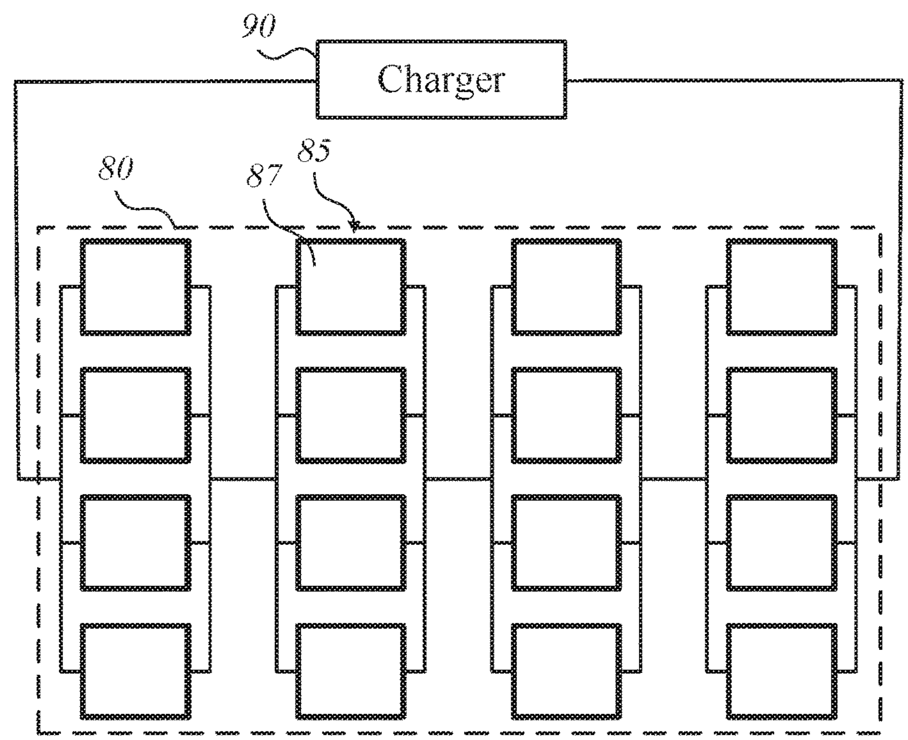
FIG. 1 is a high-level schematic illustration of a charger connected to a battery comprising multiple battery modules, each having one or more cells, according to the prior art.

In the following description, various aspects of the present invention are described. For purposes of explanation, specific configurations and details are set forth in order to provide a thorough understanding of the present invention. However, it will also be apparent to one skilled in the art that the present invention may be practiced without the specific details presented herein. Furthermore, well known features may have been omitted or simplified in order not to obscure the present invention. With specific reference to the drawings, it is stressed that the particulars shown are by way of example and for purposes of illustrative discussion of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that may be practiced or carried out in various ways as well as to combinations of the disclosed embodiments. Also, it is to be understood that the phraseology and terminology employed herein are for the purpose of description and should not be regarded as limiting.

Unless specifically stated otherwise, as apparent from the following discussions, it is appreciated that throughout the specification discussions utilizing terms such as "processing", "computing", "calculating", "determining", "enhancing", "deriving" or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices.

Embodiments of the present invention provide efficient and economical methods and mechanisms for fast charging lithium ion batteries and thereby provide improvements to the technological field of energy storage devices and their use. Systems and methods are provided for balancing battery modules following fast charging, particularly with respect to fast charging lithium ion batteries with metalloid-based anodes. Charge balancing among multiple battery modules connected in series may be carried out by short-circuiting fully charged modules while adjusting the voltage and/or current level supplied by a charger, to fully charge remaining modules. A balancing module comprising a controller and a switching circuitry may be configured to implement the charge balancing in association with the charger and its battery management system, and monitor the battery modules. Advantageously, disclosed switching balancing is more efficient than prior art passive balancing and simpler in implementation than prior art active balancing.

FIG. 1 is a high-level schematic illustration of a charger 90 connected to a battery 80 comprising multiple battery modules 85, each having one or more cells 87, according to the prior art. Fast charging batteries 80 are integrating in many applications such as consumer electronics and EVs. High charging rates of batteries 80 apply high charging currents, which are applied to batteries 80 and increase the state of charge of the batteries rapidly. However, commonly used lithium ion batteries 80 are sensitive to over-charging and to over-voltage conditions and therefore the charging and discharging thereof are managed by a battery management system (BMS, not shown) in charger 90 that controls the charging process and assures the correct voltage range operation. When one or more of battery modules 85 reaches its higher voltage cutoff limit (e.g., 4.2V or 4.3V), the BMS typically prevents charger 90 from charging that battery module(s) 85, to avoid any over charge condition. Prior art includes passive balancing and active balancing as two approaches for continuing the charging process of other battery modules 85 (which have not yet reached the higher voltage cutoff limit) in order to get the highest state of charge possible within the whole of battery 80. In the passive balancing approach, excessive energy from module(s) 85 that are fully charged is dissipated via passive loads (e.g., resistors) while the charging of the other battery modules is maintained at the same charging rate—resulting in a very low rate of charge during that time and unwanted losses on the resistor. In the active balancing approach, the energy from fully charged battery module(s) 85 is re-allocated and transferred to other, yet not fully charged modules 85—being more efficient than the passive balancing approach, but requiring very complex control systems and logic definitions, which are also limited in their applicability in the case of a large number of modules 85 in battery 80.

In the following, a switching balancing approach is provided, which uses the charging energy efficiently (improving on the passive balancing approach) by implementing a relatively simple switching scheme (improving on the active balancing approach). It is noted that the switching balancing approach may be applied as part of the charging process and/or following (possibly immediately) the charging process, and may be implemented within a given time frame for charging (e.g., by slightly shortening the main fast charging duration) or following the given time frame for charging, e.g., as the user leaves battery 80 connected to charger 90. Disclosed approaches are particularly effective for fast charging rates of batteries having anodes with metalloid-based active anode material, as explained below.

Figure 2:
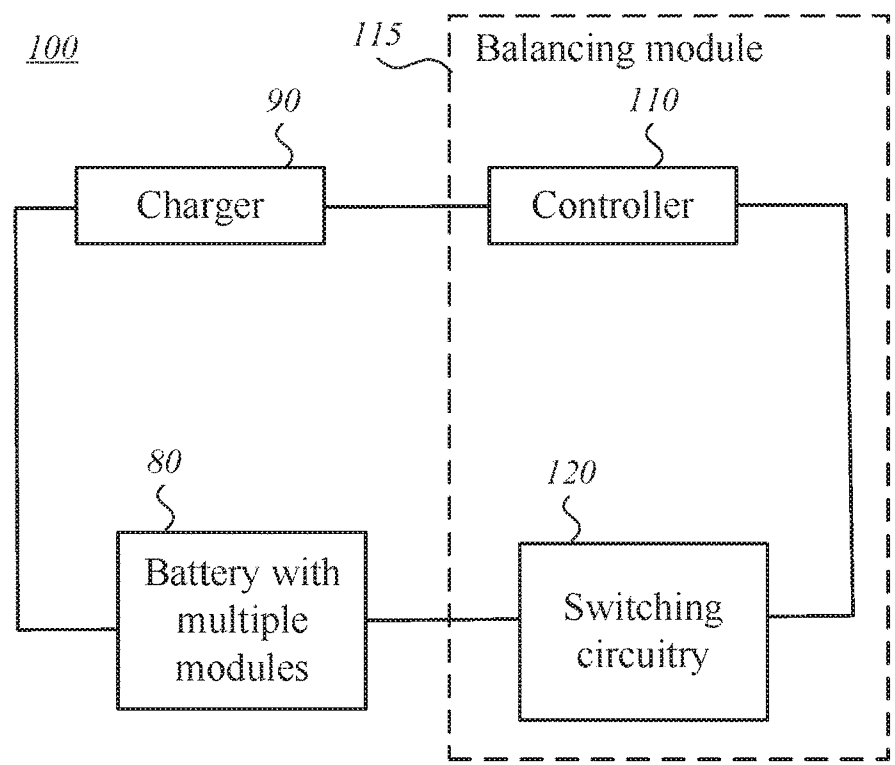
FIG. 2 is a high-level schematic illustration of a system having a balancing module, according to some embodiments of the invention.

FIG. 2 is a high-level schematic illustration of a system 100 having a balancing module 115, according to some embodiments of the invention.

System 100 comprises charger 90, battery 80 comprising battery modules 85, and balancing module 115 comprising a controller 110 and a switching circuitry 120, illustrated schematically (see a non-limiting example in FIG. 3 below). Balancing module 115 may operate with charger 90 and battery 80 to short-circuit, via switching circuitry 120, fully charged modules 85, and adjust a voltage and/or current level supplied by charger 90, to fully charge remaining modules 85. Balancing module 115 may be implemented within charger 90 and/or and battery 80, for example, controller 110 may be implemented in charger 90 and switching circuitry 120 may be implemented in battery 80. Controller 110 may be configured to identify the fully charged modules and operate switching circuitry 120 accordingly. Controller 110 may be implemented by one or more computer processors (not shown).

Figure 3:
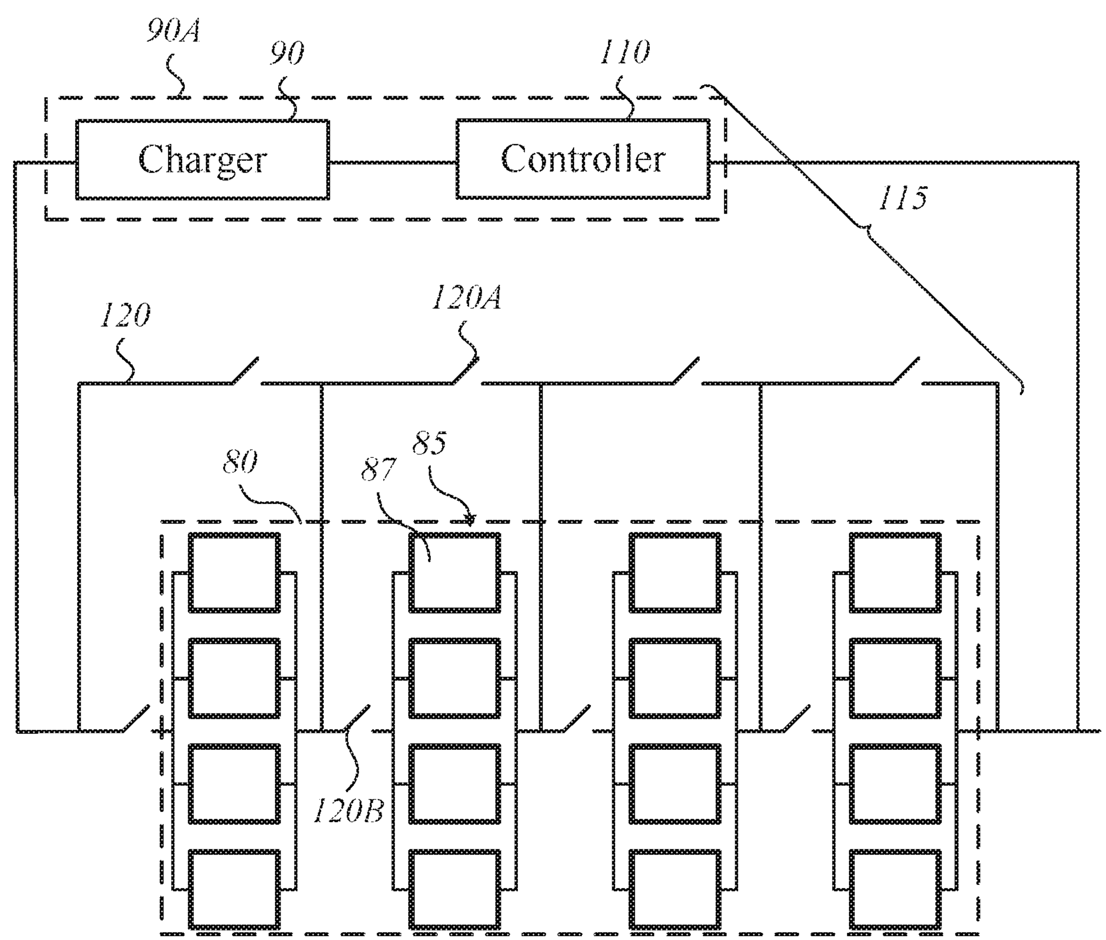
FIG. 3 is a high-level schematic illustration of a balancing module with a non-limiting example of a switching circuitry, according to some embodiments of the invention.

FIG. 3 is a high-level schematic illustration of balancing module 115 with a non-limiting example of switching circuitry 120, according to some embodiments of the invention.

Certain embodiments comprise balancing module 115 comprising controller 110 and switching circuitry 120. Controller 110 may be configured to short-circuit, via switching circuitry 120, fully charged modules 85, and adjust the voltage and/or current level supplied by charger 90 to the reduced number of modules 85—to fully charge remaining modules. For example, short circuiting modules 85 may be carried out by switches 120A and optionally disconnecting modules 85 may be carried out by switches 120B. Controller 110 may be at least partly implemented as part of charger 90, e.g., in the BMS (not shown). Possible partial or full integration of controller 110 in charger 90 (e.g. in its BMS) is indicated in FIG. 3 schematically by frame 90A that designates charger 90 with controller 110 at least partly therein. For example, the BMS may be modified and configured to short-circuit, via switching circuitry 120, fully charged modules 85, and adjust the voltage and/or current level supplied by charger 90 to the reduced number of modules 85—to fully charge remaining modules.

In certain embodiments, balancing module 115 may be used to balance a small number of cells, possibly even two cells, namely two modules 85 with one cell each 87, and/or may be used to balance a large number of modules 85 and/or modules with a large number of cells 87 in each module 85.

It is further noted that balancing modules 85 may be carried out simultaneously for several, serially-connected modules 85, with reference to their specific parameters. For example, to present a concrete non-limiting illustration, assuming four modules 85 with one cell 87 each, having, respective upper voltage cutoff limits of 4.3V, 4.2V, 4.25V, 4.27V. Balancing module 115 may be configured to bring all modules to the same voltage of 4.3V (in this non-limiting example), using different operative parameters (e.g., current, time) for each module 85.

Figure 4:
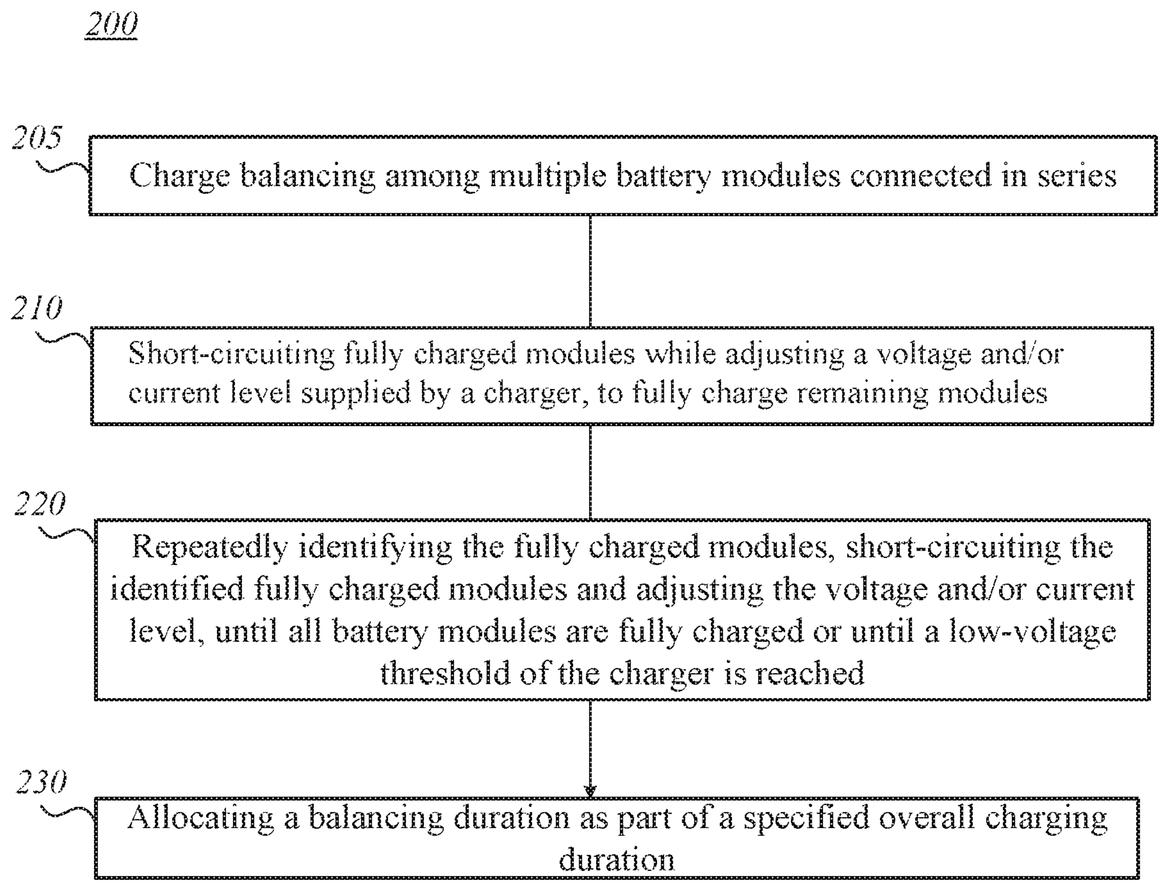
FIG. 4 is a high-level flowchart illustrating a method, according to some embodiments of the invention.

FIG. 4 is a high-level flowchart illustrating a method 200, according to some embodiments of the invention. The method stages may be carried out with respect to system 100 described above, which may optionally be configured to implement method 200. Method 200 may be at least partially implemented by at least one computer processor, e.g., in balancing module 115 and/or in controller 110 and/or in system 100. Certain embodiments comprise computer program products comprising a computer readable storage medium having computer readable program embodied therewith and configured to carry out the relevant stages of method 200. Method 200 may comprise the following stages, irrespective of their order.

Method 200 may comprise charge balancing among a plurality of battery modules connected in series (stage 205), each module comprising at least one cell. Method 200 may comprise short-circuiting fully charged modules while adjusting a voltage and/or current level supplied by a charger, to fully charge remaining modules (stage 210).

Method 200 may further comprise repeatedly identifying the fully charged modules, short-circuiting the identified fully charged modules and adjusting the voltage and/or current level, until all battery modules are fully charged or until a low-voltage threshold of the charger is reached (stage 220).

Method 200 may further comprise allocating a balancing duration as part of a specified overall charging duration (stage 230). For example, method 200 may comprise, given a specified required charging time T, defining the required balancing duration B, charging the battery modules during time T-B and performing the balancing during following time B.

Disclosed systems 100 and methods 200 may be configured to allow switching balancing through the charging process and also to take advantage of the available high charging current during the balancing stage. The battery switching may be configured to allow the cells which were not fully charged to accept the required current, by operating switching circuitry 120 to override battery modules 85 which have reached their upper level voltage and to keep providing the high current charging for the remaining modules 85 in the battery pack, in order to reach the maximum state of charge within the whole battery 80.

Battery 80 may comprise at least some battery cells having metalloid-based anodes or all of battery 80 may comprise battery cells having metalloid-based anodes, e.g., as disclosed in U.S. Patent Publication No. 2017/0294687, incorporated herein by reference in its entirety. For example, battery cells 87 may have anode active material that mainly comprises any of Si, Ge and/or Sn (e.g., >80% metalloids), in contrast to prior art cells that may have anode active material that mainly comprises graphite (e.g., >80% graphite) and may be decorated with metalloids (e.g., at <20 wt %). Disclosed lithium ion batteries 80 (and/or respective battery cells 87 thereof) may at least partly be configured, e.g., by selection of materials, to enable operation at high charging and/or discharging rates (C-rate), ranging from 3-10 C-rate, 10-100 C-rate or even above 100 C, e.g., 5 C, 10 C, 15 C, 30 C or more. It is noted that the term C-rate is a measure of charging and/or discharging of cell/battery capacity, e.g., with 1 C denoting charging and/or discharging the cell in an hour, and XC (e.g., 5 C, 10 C, 50 C etc.) denoting charging and/or discharging the cell in 1/X of an hour—with respect to a given capacity of the cell.

Any of the disclosed embodiments may be implemented in lithium ion batteries to improve their cycle life, charging/discharging rates, safety and/or capacity. Lithium ion batteries typically comprise anodes and cathodes with current collectors affixed thereto, packed with electrolyte and separator(s) in a battery pouch. Anodes are typically made of anode material particles, conductive additive(s) and binder (s), and may comprise any of the anode configurations taught, e.g., by U.S. Patent Publication No. 2017/0294687, incorporated herein by reference in its entirety. For example, anodes may be based on graphite, graphene or metalloid anode material such as Si, Ge, Sn and their combinations. Cathodes may comprise lithium metal oxide (LiMeO), when Me can be one or several metals selected from Ni, Co, Mn and Al. For example, cathodes may comprise materials based on layered, spinel and/or olivine frameworks, such as LCO formulations (based on $LiCoO_2$), NMC formulations (based on lithium nickel-manganese-cobalt), NCA formulations (based on lithium nickel cobalt aluminum oxides), LMO formulations (based on $LiMn_2O_4$), LMN formulations (based on lithium manganese-nickel oxides) lithium iron-phosphorus oxide (LFP) formulations (based on $LiFePO_4$), lithium rich cathodes, and/or combinations thereof. Separator(s) may comprise various materials, e.g., polymers such as any of polyethylene (PE), polypropylene (PP), polyethylene terephthalate (PET), poly vinylidene fluoride (PVDF), polymer membranes such as a polyolefin, polypropylene, or polyethylene membranes. Multi-membranes made of these materials, micro-porous films thereof, woven or non-woven fabrics etc. may be used as separator(s), as well as possibly composite materials including, e.g., alumina, zirconia, titania, magnesia, silica and calcium carbonate along with various polymer components as listed above.

In any of the disclsoed embodiments, electrolytes may be based on liquid electrolytes, typically linear and cyclic carbonates, such as ethylene carbonate, diethyl carbonate, propylene carbonate, VC (vinylene carbonate), FEC (fluoroethylene carbonate), EA (ethyl acetate), EMC (ethyl methyl carbonate), DMC (dimethyl carbonate) and combinations thereof and/or solid electrolytes such as polymeric electrolytes such as polyethylene oxide, fluorine-containing polymers and copolymers (e.g., polytetrafluoroethylene), and combinations thereof, as well as inorganic silica gel electrolytes, amorphous sulfides-based electrolytes etc. Electrolytes may comprise lithium electrolyte salt(s) such as $LiPF_6$, $LiBF_4$, lithium bis(oxalato)borate, $LiN(CF_3SO_2)_2$, $LiN(C_2F_5SO_2)_2$, $LiAsF_6$, $LiC(CF_3SO_2)_3$, $LiClO_4$, LiTFSI, $LiB(C_2O_4)_2$, $LiBF_2(C_2O_4)$), tris(trimethylsilyl)phosphite (TMSP), and combinations thereof. Ionic liquid(s) may be added to the electrolyte as taught by WIPO Publication No. WO 2018/109774, incorporated herein by reference in its entirety. For example, electrolytes may comprise a large proportion, e.g., 10%, 20%, 30% or more of VC and/or FEC as prominent cyclic carbonate compound, as disclosed e.g., in U.S. Pat. No. 10,199,677, incorporated herein by reference in its entirety. In certain embodiments, electrolytes may comprise linear solvent comprising at least one three-carbon and/or four-carbon chain ester, cyclic carbonate solvent and at least one lithium salt, as disclosed e.g., in U.S. patent application Ser. No. 16/243,190, incorporated herein by reference in its entirety.

Aspects of the present invention are described above with reference to flowchart illustrations and/or portion diagrams of methods, apparatus (systems) and computer program products according to embodiments of the invention. It will be understood that each portion of the flowchart illustrations and/or portion diagrams, and combinations of portions in the flowchart illustrations and/or portion diagrams, can be implemented by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or portion diagram or portions thereof.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or portion diagram or portions thereof.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or portion diagram or portions thereof.

The aforementioned flowchart and diagrams illustrate the architecture, functionality, and operation of possible implementations of systems, methods and computer program products according to various embodiments of the present invention. In this regard, each portion in the flowchart or portion diagrams may represent a module, segment, or portion of code, which comprises one or more executable instructions for implementing the specified logical function (s). It should also be noted that, in some alternative implementations, the functions noted in the portion may occur out of the order noted in the figures. For example, two portions shown in succession may, in fact, be executed substantially concurrently, or the portions may sometimes be executed in the reverse order, depending upon the functionality involved. It will also be noted that each portion of the portion diagrams and/or flowchart illustration, and combinations of portions in the portion diagrams and/or flowchart illustration, can be implemented by special purpose hardware-based systems that perform the specified functions or acts, or combinations of special purpose hardware and computer instructions.

In the above description, an embodiment is an example or implementation of the invention. The various appearances of "one embodiment", "an embodiment", "certain embodiments" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention may also be implemented in a single embodiment. Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. A method of charge balancing among a plurality of battery modules, the method comprising selectively bypassing, by a balancing module coupled between a changer and the plurality of battery modules, one or more battery modules;

serially coupling, by the balancing module, non-bypassed battery modules to each other:

fully charging, by the balancing module and the charger, the non-bypassed battery modules thereby adjusting a voltage and/or current level supplied by the charger to the non-bypassed battery modules, wherein at least one battery module of the plurality battery modules comprises a group of cells that are coupled in parallel to each other; wherein the group of cells comprises a first cell that has a first upper voltage cutoff limit and a second cell that has a second upper voltage cutoff limit that differs from the first upper voltage cutoff limit, wherein the fully charging comprises fully charging the first cell and the second cell to voltage level that equals an upper voltage cutoff limit of the first upper voltage cutoff and the second upper voltage cutoff limit.

2. The method of claim 1, further comprising repeatedly identifying one or more fully charged battery modules, bypassing the identified fully charged battery modules and adjusting the voltage and/or current level, until all of the plurality of battery modules are fully charged or until a low-voltage threshold of the charger is reached.

3. The method of claim 1, further comprising allocating a balancing duration as part of a specified overall charging duration.

4. The method of claim 3, further comprising, given the specified required charging time T, defining the required balancing duration B, charging the battery modules during time T-B and performing the balancing during following time B.

5. A balancing module comprising a controller and a switching circuitry, the balancing module operating with a charger and a battery comprising a plurality of battery modules, wherein the balancing module is configured to selectively bypass one or more battery modules;

serially couple non-bypassed battery modules to each other;

fully charge, using current supplied from the charger, the non-bypassed battery modules thereby adjusting a voltage and/or current level supplied by the charger to the non-bypassed battery modules, wherein at least one battery module of the plurality battery modules comprises a group of cells that are coupled in parallel to each other; wherein the group of cells comprises a first cell that has a first upper voltage cutoff limit and a second cell that has a second upper voltage cutoff limit that differs from the first upper voltage cutoff limit, wherein the fully charging comprises fully charging the first cell and the second cell to voltage level that equals an upper voltage cutoff limit of the first upper voltage cutoff and the second upper voltage cutoff limit.

6. A system comprising:

a charger, a battery comprising a plurality of battery modules, and a balancing module comprising a controller and a switching circuitry, the balancing module is configured to selectively bypass one or more battery modules; serially couple non-bypassed battery modules to each other; fully charge, using current supplied from the charger, the non-bypassed battery modules thereby adjusting a voltage and/or current level supplied by the charger to the non-bypassed battery modules, wherein at least one battery module of the plurality battery modules comprises a group of cells that are coupled in parallel to each other; wherein the group of cells comprises a first cell that has a first upper voltage cutoff limit and a second cell that has a second upper voltage cutoff limit that differs from the first upper voltage cutoff limit, wherein the fully charging comprises fully charging the first cell and the second cell to voltage level that equals an upper voltage cutoff limit of the first upper voltage cutoff and the second upper voltage cutoff limit, wherein the balancing module is implemented within at least one of the charger and the battery.

7. The system of claim 6, wherein the controller is implemented in the charger and the switching circuitry is implemented in the battery.

8. The system of claim 6, wherein the controller is at least partly implemented in a battery management system (BMS) of the charger.

9. The method according to claim 1 wherein the voltage level equals a higher upper voltage cutoff limit out of the first upper voltage cutoff and the second upper voltage cutoff limit.

10. The method according to claim 1 wherein the at least one battery module of the plurality battery modules is the plurality battery modules.

11. The method according to claim 1 wherein the balancing module comprises a switching circuit that has a bypass switch and a serial connection switch per each battery module.

12. The balancing module according to claim 5 wherein the voltage level equals a higher upper voltage cutoff limit out of the first upper voltage cutoff and the second upper voltage cutoff limit.

13. The balancing module according to claim 5 wherein the at least one battery module of the plurality battery modules is the plurality battery modules.

14. The balancing module according to claim 5 wherein the balancing module comprises a switching circuit that has a bypass switch and a serial connection switch per each battery module.

15. The system according to claim 6 wherein the voltage level equals a higher upper voltage cutoff limit out of the first upper voltage cutoff and the second upper voltage cutoff limit.

16. The system according to claim 6 wherein the at least one battery module of the plurality battery modules is the plurality battery modules.

17. The system according to claim 6 wherein the balancing module comprises a switching circuit that has a bypass switch and a serial connection switch per each battery module.

18. The method according to claim 1 wherein the group of cells comprises one or more additional cells in addition to the first and second cells.

* * * * *